(12) United States Patent
Lee et al.

(10) Patent No.: US 10,514,424 B2
(45) Date of Patent: Dec. 24, 2019

(54) SYSTEM FOR CHARGE-DISCHARGE CYCLER (71) Applicant: TOP RUN ENERGY SOLUTION CO., LTD., Gumi-si, Gyeongsangbuk-do (KR)

(72) Inventors: Tae Hoon Lee, Daegu (KR); Byung Gil Yoo, Gumi-si (KR); Il Kyu Lee, Gumi-si (KR)

(73) Assignee: YUYANG DNU CO., LTD., Hwaseong-si, Gyeonggi-do (KR)

( * ) Notice: Subject to any disclaimer, the term of this patent is extended or adjusted under 35 U.S.C. 154(b) by 160 days.

(21) Appl. No.: 15/636,005

(22) Filed: Jun. 28, 2017

(65) Prior Publication Data

US 2018/0149702 A1 May 31, 2018

(30) Foreign Application Priority Data

Nov. 30, 2016 (EP) ..................... 16201363

(51) Int. Cl.
*G01R 31/3842* (2019.01)
*G01R 31/36* (2019.01)
(Continued)

(52) U.S. Cl.
CPC ......... *G01R 31/3842* (2019.01); *G01R 1/203* (2013.01); *G01R 19/0092* (2013.01); *G01R 31/3644* (2013.01); *H01C 7/13* (2013.01)

(58) Field of Classification Search
CPC .............. G01R 15/146; G01R 31/3842; G01R 31/3644; G01R 1/203; G01R 19/0092; H01C 7/13
(Continued)

(56) References Cited

U.S. PATENT DOCUMENTS 5,699,036 A    12/1997  Lin et al.
6,034,521 A *  3/2000   Eckardt ................. G01R 15/22
                                                         324/126
(Continued)

FOREIGN PATENT DOCUMENTS

CN    105684104 A      6/2016
CN    108923084 A *   11/2018
(Continued)

OTHER PUBLICATIONS

European Search Report—Application EP 16201363, dated May 2016. (Year: 2016).*

(Continued)

*Primary Examiner* — Patrick Assouad
*Assistant Examiner* — Sean Curtis
(74) *Attorney, Agent, or Firm* — Rabin & Berdo, P.C.

(57) ABSTRACT

Disclosed is a system for charge-discharge cycler, particularly to a system for charge-discharge cycler in which a structure of a shunt is improved to improve performance/accuracy of a current control as a key component of an instrument for testing a secondary battery charge-discharge. A system for charge-discharge cycler has the effect of improving the degree of precision/performance of the current control during a charge/discharge inspection of the secondary battery, thereby raising the standard of development/aspect of the secondary battery and developing a charge/discharge performance tester of high performance.

9 Claims, 10 Drawing Sheets (51) Int. Cl.
  *G01R 1/20* (2006.01)
  *G01R 19/00* (2006.01)
  *H01C 7/13* (2006.01)

(58) Field of Classification Search
  USPC .................................................. 324/425–434
  See application file for complete search history.

(56) References Cited

U.S. PATENT DOCUMENTS

| | | | | |
|---|---|---|---|---|
| 6,304,062 | B1* | 10/2001 | Batson | G01R 1/203 |
| | | | | 320/134 |
| 6,377,030 | B1* | 4/2002 | Asao | H01M 10/052 |
| | | | | 320/161 |
| 7,319,304 | B2* | 1/2008 | Veloo | B60R 16/023 |
| | | | | 320/134 |
| 7,573,274 | B2* | 8/2009 | Aratani | G01R 1/203 |
| | | | | 324/713 |
| 8,466,698 | B2* | 6/2013 | Ozawa | G01R 31/364 |
| | | | | 324/713 |
| 9,293,242 | B2* | 3/2016 | Yoshioka | H01C 1/14 |
| 9,523,720 | B2* | 12/2016 | Ausserlechner | G01R 1/203 |
| 9,880,207 | B2* | 1/2018 | Ko | H01M 10/48 |
| 10,026,529 | B2 | 7/2018 | Chiku et al. | |
| 10,050,315 | B2* | 8/2018 | Kim | H01M 10/4257 |
| 2005/0057865 | A1* | 3/2005 | Veloo | B60R 16/023 |
| | | | | 361/56 |
| 2013/0314827 | A1 | 11/2013 | Sohn | |
| 2014/0266269 | A1* | 9/2014 | Ausserlechner | G01R 1/203 |
| | | | | 324/713 |
| 2016/0111757 | A1* | 4/2016 | Kim | H01M 10/4257 |
| | | | | 429/61 |
| 2018/0100877 | A1* | 4/2018 | Nakamura | G01R 1/203 |
| 2018/0113153 | A1* | 4/2018 | Jang | G01N 27/00 |
| 2018/0120359 | A1* | 5/2018 | Nakamura | G01R 19/0092 |
| 2018/0149702 | A1* | 5/2018 | Lee | G01R 31/3644 |
| 2018/0156844 | A1* | 6/2018 | Kameko | G01R 1/203 |
| 2018/0180681 | A1* | 6/2018 | Tanaka | G01R 1/203 |
| 2018/0238970 | A1* | 8/2018 | Gurtner | H01M 2/348 |
| 2018/0299510 | A1* | 10/2018 | Park | B60L 58/10 |

FOREIGN PATENT DOCUMENTS

| | | | | |
|---|---|---|---|---|
| EP | 2 068 402 A1 | 6/2009 | | |
| JP | 53-076875 U | 6/1978 | | |
| JP | 63-229801 A | 9/1988 | | |
| JP | 03-010262 U | 1/1991 | | |
| JP | 2014-053437 A | 3/2014 | | |
| JP | 2014-224707 A | 12/2014 | | |
| JP | 2016-176709 A | 10/2016 | | |
| JP | 2018092884 A | * | 6/2018 | ......... G01R 31/3644 |
| KR | 10-1384898 B1 | 4/2014 | | |
| KR | 10-2014-0134517 A | 11/2014 | | |
| KR | 20180044725 A | * | 5/2018 | ............. G01N 27/00 |

OTHER PUBLICATIONS

Partial European Search Report dated May 16, 2017.
Japanese Office Action dated Nov. 29, 2017.
Chinese Office Action dated Sep. 17, 2019.

* cited by examiner

SYSTEM FOR CHARGE-DISCHARGE CYCLER

BACKGROUND OF THE INVENTION

Field of the Invention

The present disclosure relates to a system for charge-discharger cycler, and more particularly to a system for charge-discharge cycler to enhance the degree of precision of a test for battery performance by a charge-discharge simulation of a secondary battery and a shunt connection structure of a system for charge-discharge cycler.

Description of the Related Art

As demand and technology development for an electric vehicle grow, demand on a secondary battery as an energy source is rapidly increased. There are many researches in progress for a secondary battery with high energy density and discharge voltage which are to be commercialized and used widely.

Conventionally, the Korean Patent No. 1384898 includes a function test unit for embedding a hardware for testing a battery performance by test categories, a firmware for controlling a hardware process of the function test unit, a database server for storing a history of data and a criteria information of the test, and an operating software for controlling a test by collecting test data, managing a criteria information of the test, and processing data and messages between the function test unit and the firmware.

In general, a secondary battery is configured by stacking or winding an electrode assembly having a negative electrode, a positive electrode, and a separator membrane, embedding it in a battery case made with a metal can or a laminate sheet, and then injecting an electrolyte or combining them.

A secondary battery is not permanent, but can be recharged repeatedly to be used. Thus, it is widely used as a power source of various electrical electronic devices such as a mobile phone, a PDA. For example, a current applied to a second battery system through a circuit and a shunt can be measured by mounting a shunt on a circuit provided for measuring the current. A secondary battery is employed in a main power source for a hybrid car or an electric vehicle as well as an electrical/electronic device such as a mobile phone. Thus it may be important to measure the current for a secondary battery by using a shunt.

Conventionally when a shunt of a battery charging/discharging test instrument for measuring a current is made, a shunt made of a manganese material is connected to a main body made of copper by welding with lead or silver. A straight groove for connecting with a shunt is prepared in the main body of a current conducting member made of copper and is welded with silver or lead.

However, since a shunt is made in an elongated form, a welding part is often cracked by more torque hung on the one end when strength is hung on the other end.

The change of silver soldering resistance by silver soldering at the welded part due to such cracks may cause the change of an overall resistance. When a resistance is changed and too much resistance occurs between a shunt and a circuit substrate, it may cause a problem that a charging capacity of a charging object such as a secondary battery is measured to be too small. If the current of the secondary battery is measured to be too small, the secondary battery as the charging object is charged with too much current and consequently it can cause a serious problem such as an explosion of the secondary battery, etc.

In addition, while a rapid discharge occurs in an electric vehicle for a temporary acceleration, a test for a rapid charge-discharge with a conventional device has not yet been performed under such environments. If a battery performance is not qualified, a stability problem such as overheating/fire may occur. Thus, a complete test for a rapid charge-discharge of a battery is required.

Conventionally, there is a noise problem due to a distance between a control read end and a shunt sensing unit for testing a battery charge-discharge cycle performance, and another problem with no saturation when the applied current is 50 A or more.

DOCUMENTS OF RELATED ART (Patent Document 1) Korean Patent No. 10-1384898 (registered on 7 Apr. 2014)

SUMMARY OF THE INVENTION

The present disclosure is derived to solve the aforementioned problems, and is directed to providing a system for charge-discharge cycler in which a structure of a shunt is improved to improve performance/accuracy of a current control as a key component of an instrument for testing a secondary battery charge-discharge.

The present disclosure is also is directed to providing a system for charge-discharge cycler which enables to test a battery load under a real driving condition during a complete inspection with a charge-discharge test before releasing a battery cell for an electric vehicle.

In order to achieve the purpose as above, a system for charge-discharge cycler may include a current measuring circuit unit 300 for measuring a current wave form of charge-discharge with a voltage across a shunt according to a charge-discharge signal; and a current conducting member 260 combined with a shunt which is connected to the current measuring circuit unit electrically. And a shunt connecting groove 270 is provided at the end of the current conducting member 260 for insertion into the inside of the current conducting member, and a side connecting groove 280 penetrating the current conducting member is formed perpendicular to the way the shunt connecting groove is formed.

Preferably, an end of shunt is combined with a shunt connecting groove for a current conducting member, and the shunt and the current conducting member are combined by silver soldering at the shunt connecting groove and the side connecting groove. The current conducting member 260 is formed in 'ㄷ' shape where a plurality of shunts are connected. And the side connecting groove 280 of the current conducting member may be formed in a looped curve.

In addition, a current measuring circuit unit 300 for measuring a current wave form of charge-discharge with a voltage across a shunt according to a charge-discharge signal; and a current conducting member 260' combined with a shunt which is connected to the current measuring circuit unit electrically are included, and a shunt connecting groove is formed at one end of the current connecting member 260', the shunt is connected by passing through the current conducting member.

And a current measuring circuit unit 300 for measuring a current wave form of charge-discharge with a voltage across a shunt according to a charge-discharge signal; and a current conducting member 260 combined with a shunt which is connected to the current measuring circuit unit electrically are included, and the shunt includes a first shunt disposed in the current measuring circuit unit and a second shunt disposed apart from the first shunt. The current measuring circuit unit includes a sensing unit which is selectively connected according to an applied current, and is arranged to be adjacent to the sensing unit which is connected to a connecting part of the first shunt or the second shunt. And a cooling fan may be included for cooling the heat from a first shunt and a second shunt.

Preferably, a shunt 200 may include a first shunt body portion 210 connected to the current measuring circuit unit by a first current conducting member, a connecting body portion 230 extended from an end of the first shunt body portion, a second shunt body portion 220 connected to the current measuring circuit unit by being connected from the connecting body portion.

In addition, a shunt has an insulating layer in the opposite sides made with a manganese material, may include a heat sink located on the insulating layer, and a cooling fan for cooling the heat from the shunt In addition, a shunt 200 may include a first shunt body portion 210 connected to the current measuring circuit unit by a first current conducting member, a connecting body portion 230 extended from an end of the first shunt body portion, a second shunt body portion 220 connected to the current measuring circuit unit by being connected from the connecting body portion.

The connecting body portion 230 is prepared such that the first shunt body portion and the second shunt body portion face each other. The connecting portion of a first shunt body portion connected to the current measuring circuit unit is located to be adjacent to the connection portion of a second shunt body portion connected to the current measuring circuit unit. In addition, the shunt 200 may have a Kelvin sensing terminal formed by a boundary space 250 formed at one end of shunt passing through the shunt.

A current measuring circuit unit 300 measures the original charge-discharge current Tr/Tf of a battery, and can measure DCIR in 1 ms unit.

The system for charge-discharge cycler according to the present invention can improve the degree of the degree of precision/performance of a current control during a charge-discharge test of a secondary battery, and raise the standard of development/aspect of the secondary battery.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinbelow, exemplary embodiments of the present invention will be described in detail with reference to the accompanying drawings. Throughout the drawings, the same reference numerals will refer to the same or like parts.

The present disclosure relates to a system for charge-discharge cycler, which can stabilize a current according to time and improve a precision level of a current according to a shape and a combination structure of a shunt during charge-discharge.

In addition, the present invention is characterized in that a drastic charge-discharge state of an electric vehicle during a drive of an electric vehicle can simulated in the same manner as an actual charge-discharge applied to a battery, thereby shortening the inspection time.

The present invention will be described more fully hereinafter with reference to the accompanying drawings, in which exemplary embodiments are shown.

Figure 1:
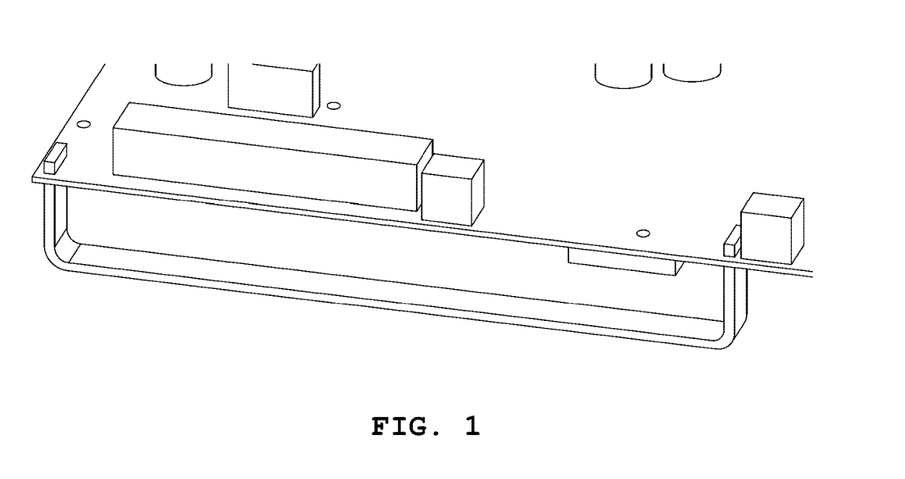
FIG. 1 is illustrates a structure of a shunt.
Figure 2:
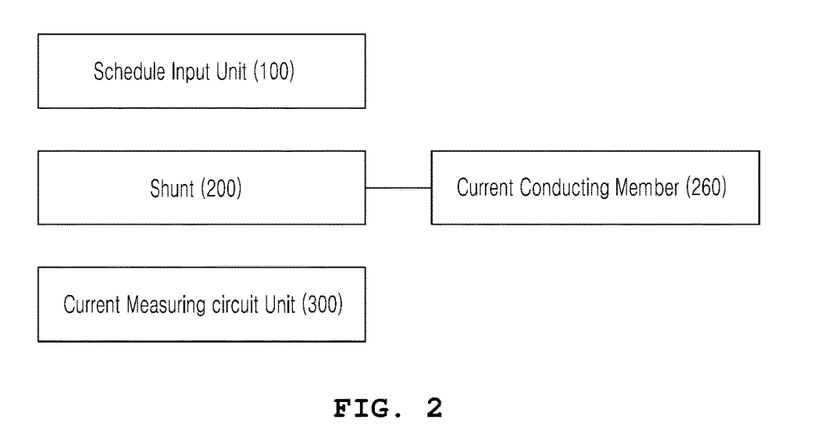
FIG. 2 is a diagram of a system for charge-discharge cycler according to an exemplary embodiment of the present invention.
Figure 3:
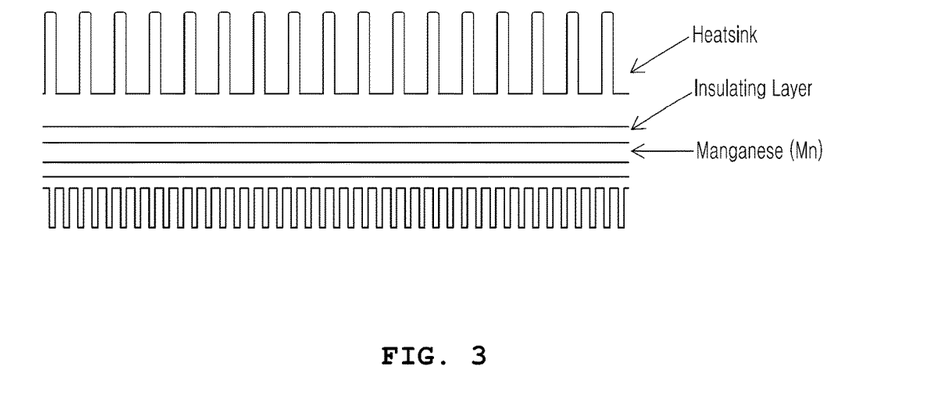
FIG. 3 is a diagram illustrating a structure of a shunt of a system for charge-discharge cycler according to an exemplary embodiment of the present invention.

As illustrated in FIG. 2, a system for charge-discharge cycler may include a schedule input unit 100, a shunt 200, a current measuring circuit unit 300.

The schedule input unit 100 is provided for producing and input a charge/discharge schedule signal applied to a battery for a test of a battery operation.

At this time, the charge/discharge schedule signal is for a cell test. The schedule input unit 100 receives the charge/discharge schedule signal, and determines the charge/discharge schedule signal so that the conditions that affect the charge/discharge operation characteristic of the battery can be simulated in the same manner as the actual conditions.

The schedule input unit 100 can distinguish a schedule signal for testing the charge/discharge function of the secondary battery and a schedule signal for testing the fluctuating charge/discharge cycle. The charge/discharge function test of the secondary battery is for testing the battery performance by switching charging and discharging according to time, and the fluctuating charge/discharge cycle test is for testing a battery performance according to the charge/discharge state of an electric vehicle during a real drive.

Such a charge/discharge schedule signal can simulate the actual charge/discharge state of an electric vehicle including a triangular wave, a sine wave, a half-wave pulse waveform and an arbitrary waveform. Thus, the present disclosure may include a function to shorten time to mass production or inspection by using a precise pulse of a high current. The charge/discharge schedule signal of the input waveform can be entered for the test as a various waveform input depending on a charge/discharge environment by using the Programmable Pulse Compiler.

The current measuring circuit unit 300 is provided to measure a current wave form of charge-discharge with a voltage across a shunt according to a charge-discharge signal. The current measuring circuit unit 300 measures the original charge-discharge current Tr/Tf of a battery, and can measure DCIR in 1 ms unit.

In implementing this feature, the degree of precision/performance of the current control can be improved by a structure of combination, a structure of the current conducting member, and a shunt, which are described below.

It is possible to solve the problem that noise is generated due to the distance between the shunt sensing unit and the current measuring circuit unit, i.e. the distance between a reading terminal of the control board and the shunt sensing unit for testing the charge/discharge cycle performance of the battery.

First, a system for charge-discharge cycler according to an exemplary embodiment includes a current conducting member 260 combined with a shunt which is connected to a current measuring circuit unit electrically.

Figure 8:
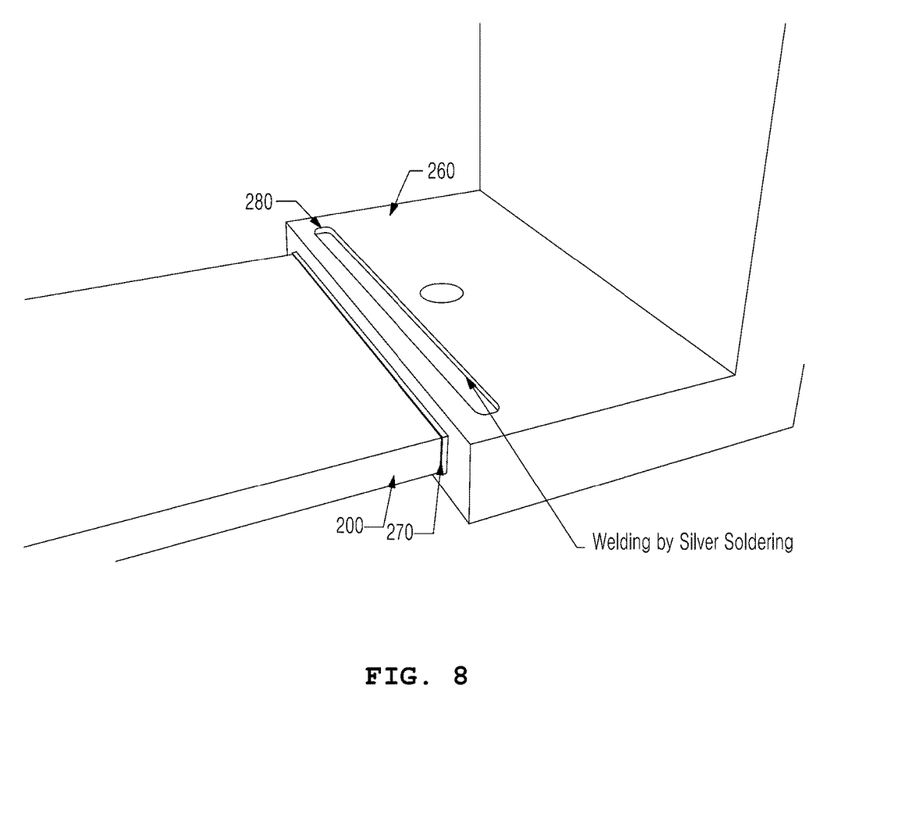
FIG. 8 illustrates a structure of a shunt combination of a system for charge-discharge cycler according to an exemplary embodiment of the present invention.
Figure 9:
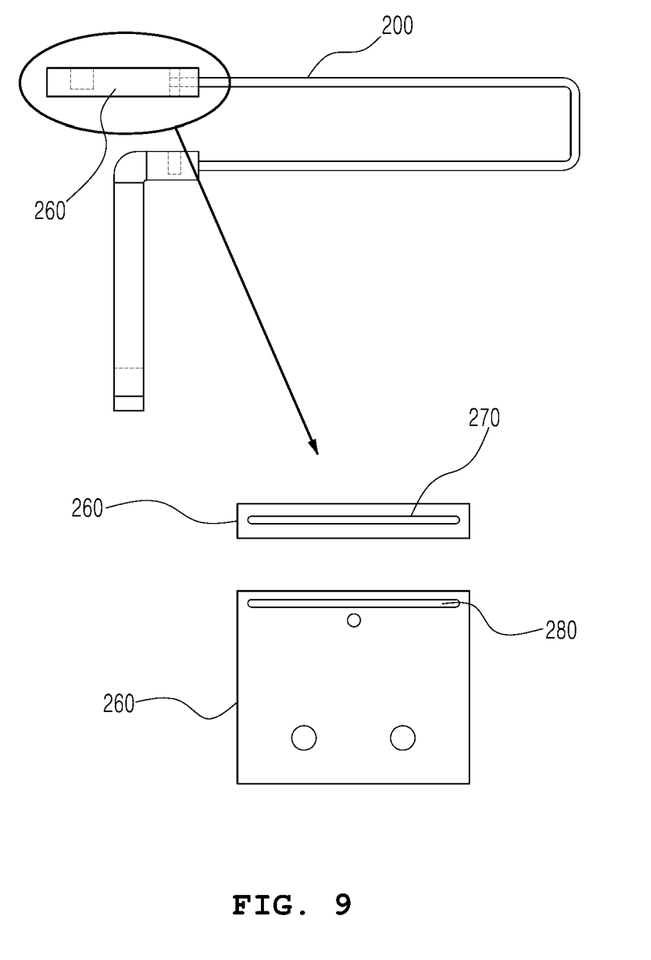
FIG. 9 illustrates a structure of a current conducting member of a system for charge-discharge cycler according to an exemplary embodiment of the present invention.

Referring to FIGS. 8-9, an exemplary embodiment of the current conducting member 260 is described as below.

For the current conducting member 260, a shunt connecting groove 270 is provided at the end of the current conduction member 260 for insertion into the inside of the current conducting member, and a side connecting groove 280 penetrating perpendicular to the way the shunt connecting groove is formed.

At this time, the current conducting member 260 is combined with the shunt so that one end of the shunt is inserted into the shunt coupling groove 270. The shunt and the current conducting member are combined in a structure by welding the shunt connecting groove 270 and the side connecting groove 280 with silver soldering.

FIG. 9 illustrates the structure of the current conducting member. In FIG. 9, a front view of the shunt connecting groove 270 in which the current conducting member 260 and the shunt are connected is shown below the arrow sign. The below drawing as viewed from above the current conducting member illustrates that the shunt connecting groove 270 is formed inside the current conducting member 260 and the side connecting groove 280 is formed penetrating perpendicular to the way the shunt connecting groove 270 is formed.

The width of the shunt connecting groove 270 is smaller than one of the current conducting member 260 so that silver soldering is performed to the side of the shunt connecting groove and the side connecting groove 280 is formed in the shape of a closed curve to prevent the shunt from falling out sideways.

The side connecting groove of the current conducting member 260 is formed in the shape of a closed curve, thereby increasing the welded area by the silver soldering. Thus, when combined with the shunt, the opposite ends of the shunt are combined with the shunt connecting groove and the side connecting groove by welding the inside of the side connecting groove. Thus, it is possible to maintain a higher bonding strength.

According to such combining structure, it appears that the two parts at the opposite ends of the shunt (the shunt connecting groove, the side connecting groove) are holding the shunt by welding the shunt connecting groove and the side connecting groove with silver soldering. Thus, even when a torque due to an external force is generated, there is not high possibility that cracks will occur due to damage on the portion welded with silver soldering.

Figure 11:
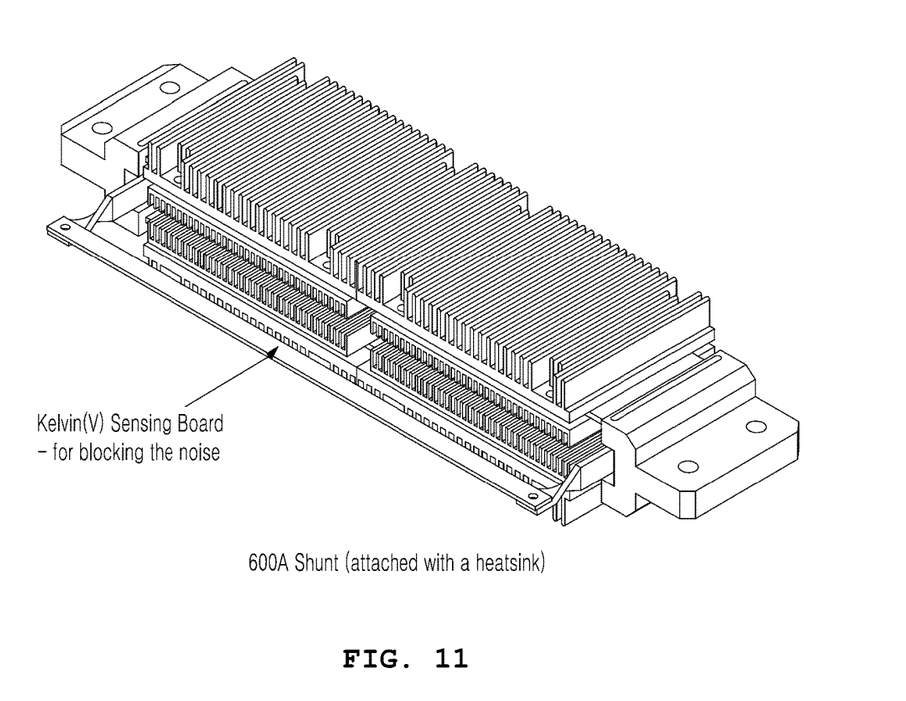
FIG. 11 illustrates a structure of Kelvin (V) sensing board and a shunt of a system for charge-discharge cycler according to an exemplary embodiment of the present invention.

The current conducting member 260 of the system for charge-discharge cycler according to the exemplary embodiment is formed in a '⊏' shape as shown in FIG. 11 and it can be combined with a plurality of shunts. In FIG. 11, the shunt is combined with the '⊏' shaped current conducting member in the form of a straight line, and the Kelvin (V) sensing board is combined to block the noise.

Figure 10:
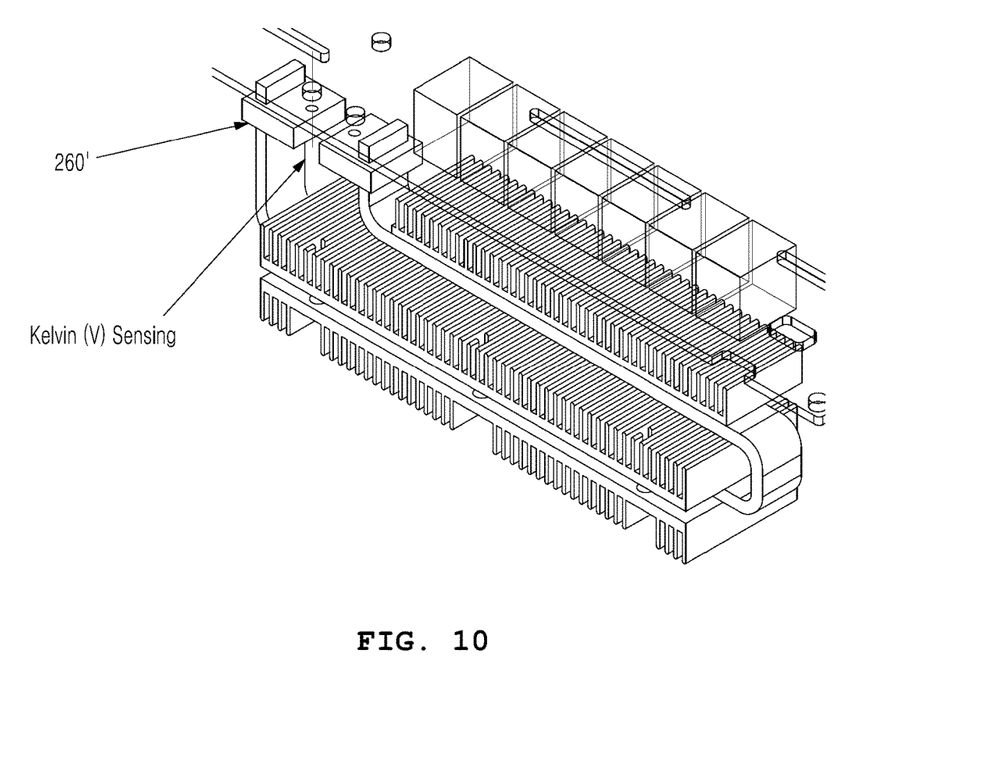
FIG. 10 illustrates a structure of a shunt attached with a heatsink of a system for charge-discharge cycler according to an exemplary embodiment of the present invention.

Meanwhile, in the system for charge-discharge cycler according to an exemplary embodiment of the present invention, another exemplary embodiment of the current conducting member 260' will be described with reference to FIG. 10 as in the following.

A shunt connecting hole 1 is formed at one end of the current conducting member 260'. a shunt is combined through the current conducting member 260'. The current conducting member 260' is characterized by a structure in which the shunt is combined with the current conducting member by being welded with silver soldering in the shunt hole 1.

Figure 7:
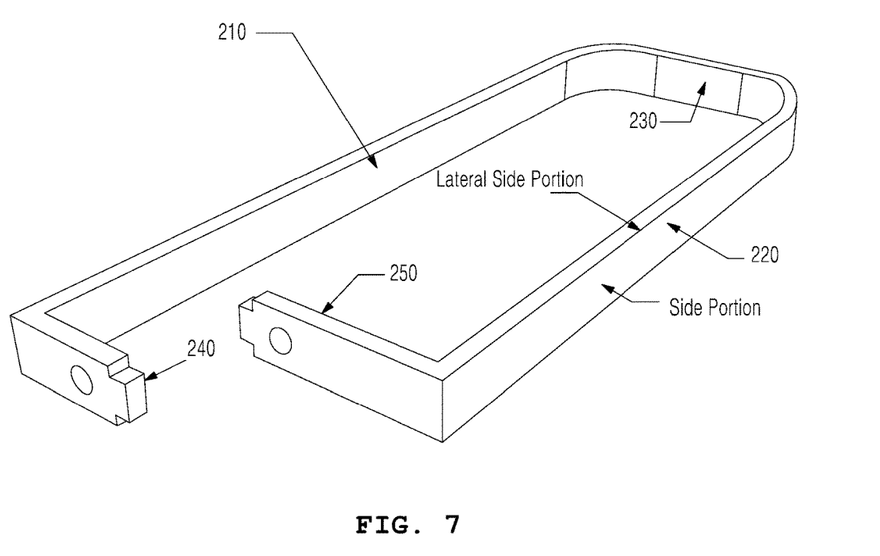
FIG. 7 illustrates a shape of a shunt of a system for charge-discharge cycler according to an exemplary embodiment of the present invention.

Next, the structure of the shunt 200 combined with the current conducting member 260 and 260' will be described with reference to FIG. 7.

The shunt 200 is electrically combined with the current measuring circuit unit through the current conducting member 260 and 260'. The shunt 200 may include a first shunt body portion 210, a connecting body portion 220 extending from an end of the first shunt body portion, and a second body portion 230 extending from the connecting body portion and electrically connected to the current measuring circuit unit.

Here, the connecting body portion 220 is formed so that the first shunt body portion and the second shunt body portion are opposed to each other and are located in such a way that the distance between the end of the shunt in which the first shunt body portion and the second shunt body portion are combined with the current measuring circuit unit (Kelvin (V) sensing) and the end of PCB board is close. With this structure, the connecting portion of the first shunt body portion combined with the current measuring circuit unit and the connecting portion of the second shunt body connecting unit connected to the current measuring circuit unit are arranged to be adjacent to each other so that accuracy can be improved by reducing the noise.

In addition, the shunt 200 may be formed in a way that an auxiliary space 240 is formed at the ends of the first shunt body portion 210 and the second shunt body portion 220, protruding with a width less than the first shunt body portion and the second shunt body portion to be fit into the current measuring circuit unit 300.

In addition, a boundary space 250 formed in the shape of a circular hole in the inward part of an auxiliary space 240 of the shunt 200 may pass through the shunt that a Kelvin sensing terminal can be formed.

The shunt 200 may also include a heat sink disposed on an insulating layer which is disposed on opposite surfaces made of a manganese material And a cooling fan for cooling the heat generated in the shunt may be included.

Figure 13:
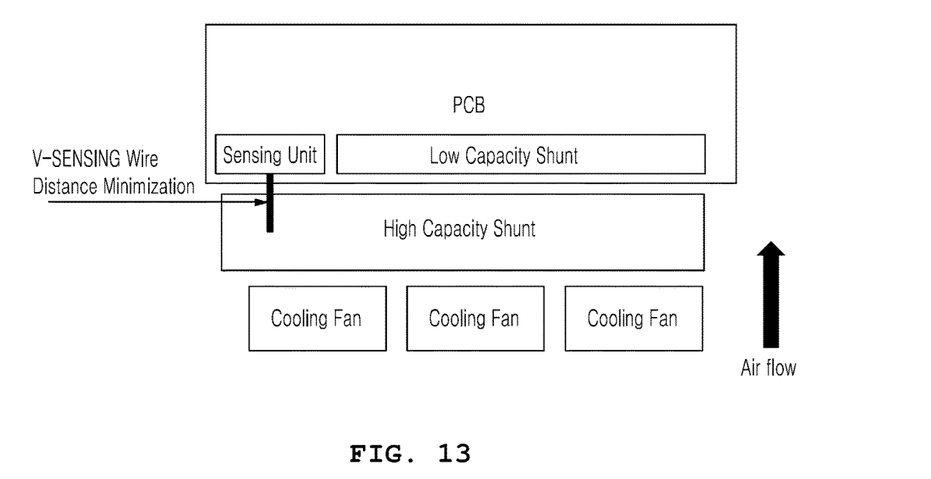
FIG. 13 illustrates a structure minimizing a distance of a V-SENSING wire between a sensing unit, i.e. a current measuring circuit unit and a shunt of a system for charge-discharge cycler according to an exemplary embodiment of the present invention.
Figure 14:
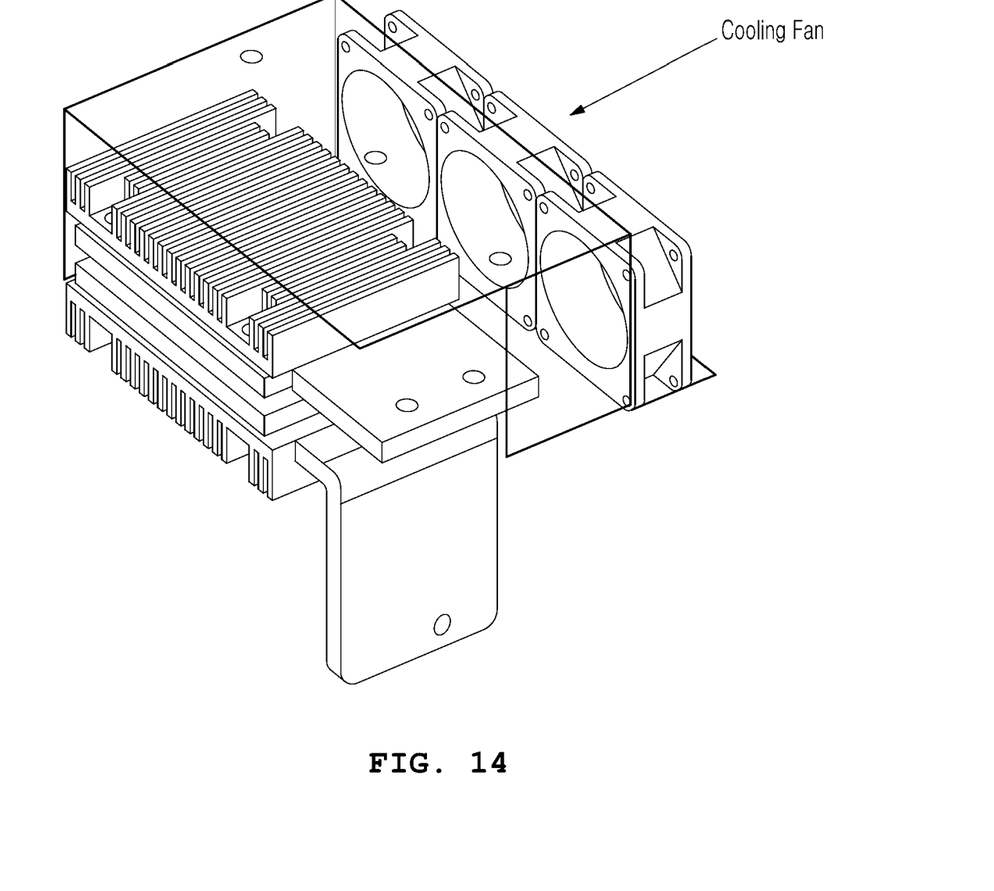
FIG. 14 illustrates a structure of a cooling fan and a shunt for large amounts of a system for charge-discharge cycler according to an exemplary embodiment of the present invention.

Meanwhile, another embodiment of a system for charge-discharge cycler according to an exemplary embodiment of the present invention will be described with reference to FIG. 13 as in the following.

A current measuring circuit unit 300 for measuring a charge/discharge current waveform with a voltage across the shunt according to a charge/discharge test signal, and a current conducting member 260 combined with a shunt electrically connected to the current measuring circuit unit are included.

In this embodiment, the shunt includes a first shunt (a low-capacity shunt, a shunt combined with the current conducting member in the second embodiment) disposed in the current measuring circuit unit, and a second shunt (a high-capacity shunt, a shunt combined with the current conducting member in the first embodiment), and may include a cooling fan for cooling the heat generated in the first shunt and the second shunt.

The first shunt is disposed in the current measuring circuit unit, and the second shunt is disposed apart from the first shunt. The current measuring circuit unit may include a sensing unit selectively connecting the first shunt or the second shunt according to an applied current. At this time, the sensing unit may be disposed so that the first shunt or the second shunt connecting portion is adjacent to the sensing unit. As the distance between the sensing unit and the first shunt or the sensing unit and the second shunt is minimized, the noise can be decreased.

Figure 12:
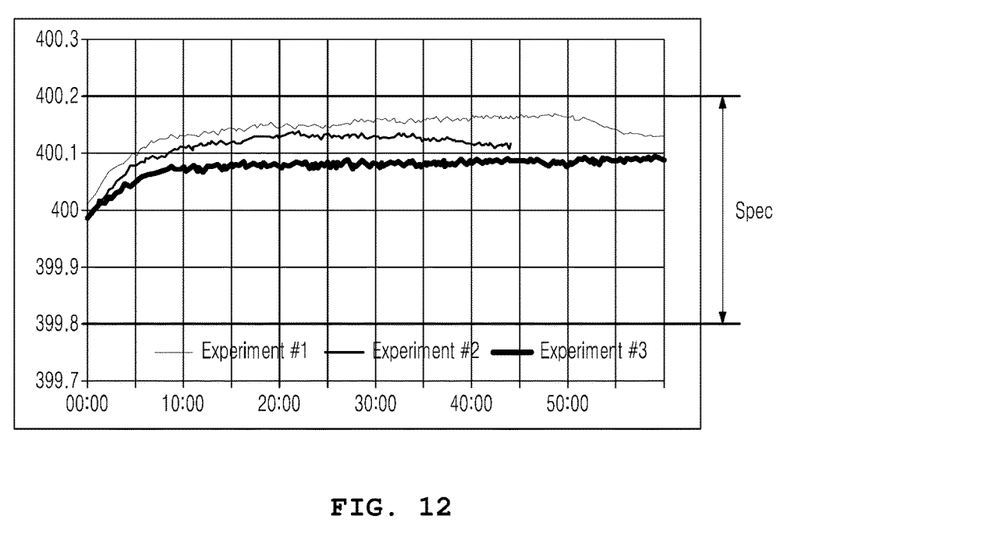
FIG. 12 is a graph of a shunt stabilization test a system for charge-discharge cycler according to an exemplary embodiment of the present invention.

As shown in FIG. 12, the present invention can improve the current accuracy according to the structure of combination and the shape of the shunt during charge/discharge and stabilize the current according to time, as shown in the graph of FIG. 12 through experiments.

The shunt of the system for charge-discharge cycler according to the present embodiment can be produced as if it is stamped by a press or the like, and a Kelvin sensing terminal is formed at the same time when this shunt is produced. Since a current measuring device such as an ammeter can be connected to the Kelvin sensing terminal in a circuit to perform a precise current measurement, there is no need to scrape the surface of the shunt and connect an ammeter to the part so that accurate current measurement can be performed. Thus, productivity can be increased.

When producing a shunt (when cutting a manganese board), the Kelvin sensing terminal is also implemented. Thus, there is no additional cost to implement the sensing point. That is, since there is no additional cost for implementing the sensing point, the production cost can be lowered.

The shunt of the system for charge-discharge cycler according to an exemplary embodiment of the present invention is configured such that the first shunt body portion 210 and the second shunt body portion 220 are arranged facing each other The first shunt body portion 210 and the second shunt body portion 210 are configured to face each other by forming a connecting body portion 230 by bending the substantially middle portion of the shunt-processed flat iron made of manganese or manganese alloys (for example, a mixed alloy of manganese and copper, etc.).

Figure 4:
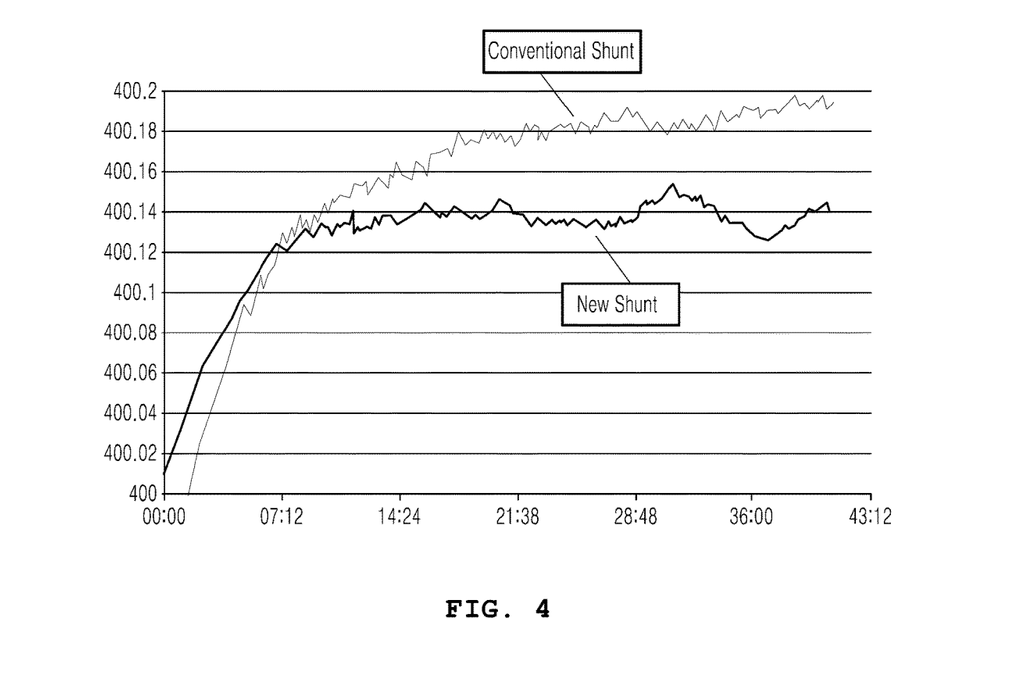
FIG. 4 is a graph of a current stabilization characteristic according to time and a shunt coupling in a system for charge-discharge cycler according to an exemplary embodiment of the present invention.

FIG. 4 is a graph of a current stabilization characteristic according to time and a shunt combination in a system for charge-discharge cycler according to an exemplary embodiment of the present invention.

The system for charge-discharge cycler according to an exemplary embodiment of the present invention generates and applies a charge/discharge schedule signal to perform a battery load test on the actual running environment of an electric vehicle, and a low current (0.1 A) CCCV Cut is possible for 400 A facilities. It also measures DCIR directly in the unit of 1 ms and can measure IEC-62576 DCIR.

The operating system may be able to drive the charge/discharge schedules created by the user. In addition, one current measuring circuit unit channel can be operated simultaneously on multiple channels, and the screen size can be adjusted on the display of the charge-discharge cycler according to the operator's preference. On this display, various information such as Volt/Current/Watt/Temp Ocv can be displayed.

Figure 5:
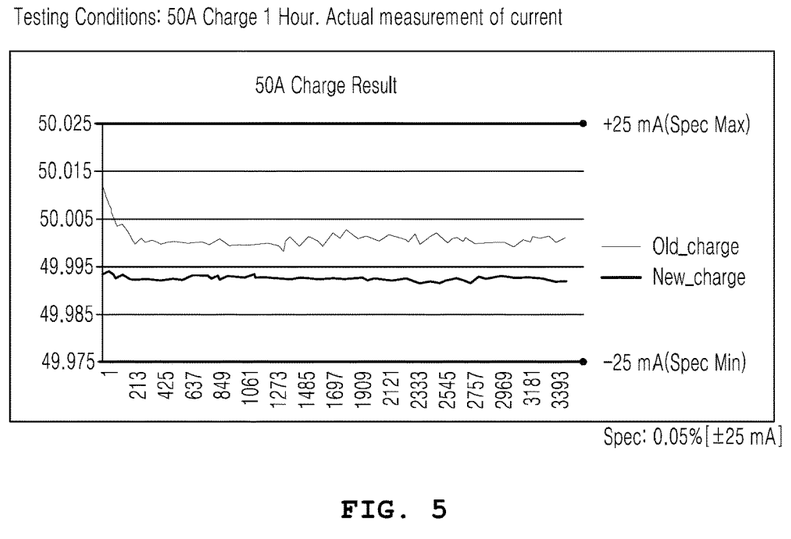
FIGS. 5-6 illustrate a current graph according to sensing minimization and a shunt shape of a system for charge-discharge cycler according to an exemplary embodiment of the present invention.
Figure 6:
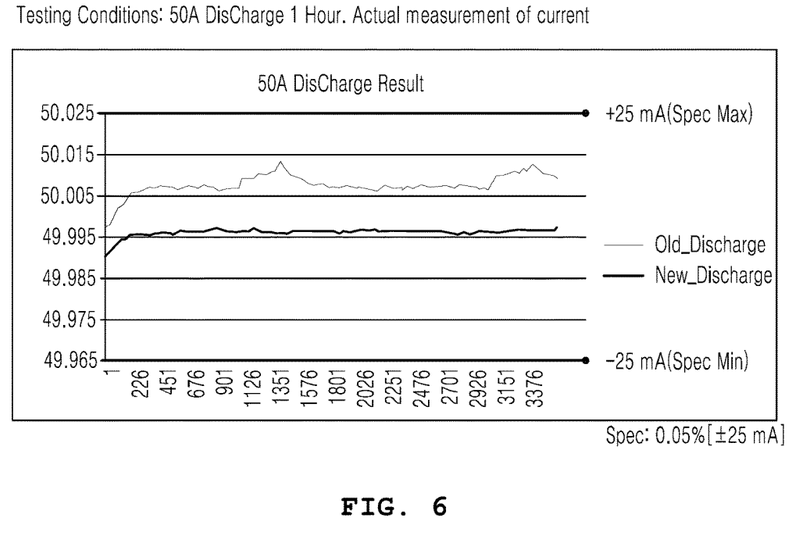

FIGS. 5 and 6 are graphs showing a current curve according to sensing minimization and a shunt shape of a system for a charge-discharge cycler according to an exemplary embodiment of the present invention.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A system for charge-discharge cycler comprising: a current measuring circuit unit for measuring a current wave form of charge- discharge with a voltage across a shunt according to a charge-discharge signal; and a current conducting member combined with a shunt which is connected to the current measuring circuit unit electrically, wherein a shunt connecting groove is provided at the end of the current conducting member for insertion into the inside of the current conducting member, and a side connecting groove penetrating the current conducting member is formed perpendicular to the way the shunt connecting groove is formed, wherein the shunt comprises a first shunt body portion connected to the current measuring circuit unit by a first current conducting member; a connecting body portion extended from one end of the first shunt body portion; and a second shunt body portion extended from the connecting body portion and connected to the current measuring circuit unit and the second current conducting member.

2. The system for charge-discharge cycler of claim 1, wherein one end of the shunt is combined with the shunt connecting groove for the current conducting member, and the shunt and the current conducting member are combined by silver soldering at the shunt connecting groove and the side connecting groove.

3. The system for charge-discharge cycler of claim 1, wherein the current conducting member is formed in 'u' shape with which a plurality of shunts are combined.

4. The system for charge-discharge cycler of claim 1, wherein the side connecting groove is formed in the shape of a closed curve.

5. The system for charge-discharge cycler of claim 1, wherein the shunt has a structure that insulating layers are provided on the opposite sides of a manganese material, and a heat sink is located on the insulating layer.

6. The system for charge-discharge cycler of claim 1, wherein the shunt has a structure that insulating layers are provided on the opposite sides of a manganese material, a heat sink is located on the insulating layer, and a cooling fan is included for cooling the heat from the shunt.

7. A system for charge-discharge cycler comprising: a current measuring circuit unit for measuring a current wave form of charge-discharge with a voltage across a shunt according to a charge-discharge signal; and a current conducting member combined with a shunt which is connected to the current measuring circuit unit electrically, wherein a shunt connecting groove is provided at the end of the current conducting member for insertion into the inside of the current conducting member, and a side connecting groove penetrating the current conducting member is formed perpendicular to the way the shunt connecting groove is formed, wherein the shunt comprises a first shunt body portion connected to the current measuring circuit unit by a first current conducting member; a connecting body portion extended from an end of the first shunt body portion; a second shunt body portion connected to the current measuring circuit unit by being connected from the connecting body portion, wherein the connecting body portion is arranged such that the first shunt body portion and the second shunt body portion are opposed to each other and the connecting portion of the first shunt body portion connected to the current measuring circuit unit is located to be adjacent to the connecting portion of the second shunt body portion connected to the current measuring circuit unit.

8. The system for charge-discharge cycler of claim 1, wherein a boundary space formed at one end of the shunt passes through the shunt to form a Kelvin sensing terminal.

9. The system for charge-discharge cycler of claim 1, wherein the current measuring circuit unit measures the original charge-discharge current Tr/Tf of a battery, and can measure DCIR in 1 ms unit.

* * * * *